United States Patent
Kim et al.

(10) Patent No.: US 9,230,623 B2
(45) Date of Patent: Jan. 5, 2016

(54) MAGNETIC MEMORY DEVICES AND METHODS OF OPERATING THE SAME

(71) Applicant: Samsung Electronics Co., Ltd., Suwon-Si, Gyeonggi-Do (KR)

(72) Inventors: Kwang-seok Kim, Seongnam-si (KR); Ung-hwan Pi, Seoul (KR); Kee-won Kim, Suwon-si (KR); Sung-chul Lee, Osan-si (KR); Young-man Jang, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 224 days.

(21) Appl. No.: 13/923,849

(22) Filed: Jun. 21, 2013

(65) Prior Publication Data
US 2013/0343118 A1 Dec. 26, 2013

(30) Foreign Application Priority Data
Jun. 21, 2012 (KR) .................. 10-2012-0066983

(51) Int. Cl.
| | |
|---|---|
| *G11C 11/00* | (2006.01) |
| *G11C 11/16* | (2006.01) |
| *H01L 27/22* | (2006.01) |
| *H01L 43/08* | (2006.01) |

(52) U.S. Cl.
CPC ............ *G11C 11/161* (2013.01); *H01L 27/228* (2013.01); *H01L 43/08* (2013.01)

(58) Field of Classification Search
CPC ......... G11C 11/16; G11C 11/15; H01L 43/08
USPC .................................. 365/158, 171, 173, 148
See application file for complete search history.

(56) References Cited

U.S. PATENT DOCUMENTS

| | | | | |
|---|---|---|---|---|
| 7,369,428 | B2* | 5/2008 | Jeong ............................ | 365/158 |
| 8,102,700 | B2* | 1/2012 | Liu et al. ...................... | 365/158 |
| 8,208,295 | B2* | 6/2012 | Dieny ........................... | 365/171 |

(Continued)

FOREIGN PATENT DOCUMENTS

| | | |
|---|---|---|
| KR | 2009-0122544 A | 12/2009 |
| KR | 2010-0011558 A | 2/2010 |

(Continued)

OTHER PUBLICATIONS

Park et al."Influence of the Magnetic on the Effective Mass and the Rashba effect in an IN0.53 Ga0.47 as Quantum-well Structure" Journal of the Korean Physical Society, vol. 57, No. 6, pp. 1929-1932, Dec. 2010.*

(Continued)

*Primary Examiner* — Son Dinh
(74) *Attorney, Agent, or Firm* — Harness, Dickey & Pierce, P.L.C.

(57) ABSTRACT

Magnetic memory devices, and methods of operating the same, include a magnetoresistive element including a free layer, a pinned layer, and a separation layer between the free layer and the pinned layer. The devices, and methods, further include a first conductive line connected to the free layer and configured to apply a Rashba field to, or induce the Rashba field in, the free layer, and a second conductive line spaced apart from the free layer and configured to apply an external magnetic field to the free layer. A magnetization direction of the free layer is switchable by application of the Rashba field and the external magnetic field to the free layer.

33 Claims, 11 Drawing Sheets

(56) References Cited

U.S. PATENT DOCUMENTS

2011/0147866 A1    6/2011    Sun et al.
2011/0241139 A1    10/2011    Yen et al.

FOREIGN PATENT DOCUMENTS

| | | |
|---|---|---|
| KR | 2010-0004109 U | 4/2010 |
| KR | 2011-0134447 A | 12/2011 |

OTHER PUBLICATIONS

Miron, I. et al. "Perpendicular switching of a single ferromagnetic layer induced by in-plane current injection". Nature, vol. 476, pp. 189-194; Aug. 2011.

\* cited by examiner

MAGNETIC MEMORY DEVICES AND METHODS OF OPERATING THE SAME

CROSS-REFERENCE TO RELATED APPLICATION

This application claims the benefit of priority under 35 U.S.C. §119 from Korean Patent Application No. 10-2012-0066983, filed on Jun. 21, 2012, in the Korean Intellectual Property Office, the disclosure of which is incorporated herein by reference in its entirety.

BACKGROUND

1. Field

Example embodiments relate to magnetic memory devices and methods of operating the same.

2. Description of the Related Art

Magnetic random access memories (MRAMs) are memory devices that store data by using a variation in resistance of a magnetic tunneling junction (MTJ) element. The resistance of the MTJ element varies according to a magnetization direction of a free layer. That is, when the magnetization direction of the free layer is the same as a magnetization direction of a pinned layer, the MTJ element has low resistance. When the magnetization direction of the free layer is opposite to the magnetization direction of the pinned layer, the MTJ element has high resistance. A case where the MTJ element has the low resistance may correspond to data '0', and a case where the MTJ element has the high resistance may correspond to data '1'. Because MRAMs are non-volatile, capable of high speed operations and have high endurance, MRAMs have gained attention as one of the next generation non-volatile memory devices.

A typical MRAM includes an MTJ element having a horizontal magnetization, and uses a digit line and a bit line to switch a magnetization direction of a free layer. Such an MRAM uses an MTJ element having a horizontal magnetization, and also has a relatively complicated structure, and accordingly, it is difficult to realize high-densification.

In the case of a spin transfer torque magnetic random access memory (STT-MRAM) that does not use a digit line, a magnetization direction of a free layer is switched by using a spin torque that occurs due to a current flowing through an MTJ element. However, to secure data retention characteristics of a free layer, a material with high magnetic anisotropy energy is used as a free layer material. When a material having a high magnetic anisotropy is used for the free layer material, an amount of the current (that is, a switching current) required to switch a magnetization direction of the free layer increases. Accordingly, a large-size cell transistor is required for supplying the switching current. In addition, in the case of the STT-MRAM, a writing current needs to be repeatedly provided to the MTJ element. Accordingly, problems related to endurance and reliability of a tunneling layer interposed between a free layer and a pinned layer of an MTJ element may occur.

SUMMARY

Example embodiments relate to magnetic memory devices and methods of operating the same.

Provided are magnetic memory devices having high-density (high integration) and high performance.

Provided are magnetic memory devices having improved endurance and reliability.

Provided are magnetic memory devices capable of suppressing or preventing writing error and cross talk.

According to example embodiments, a magnetic memory device includes a magnetoresistive element including a free layer, a pinned layer, and a separation layer between the free layer and the pinned layer; a first conductive line connected to the free layer and configured to apply a Rashba field to the free layer; and a second conductive line spaced apart from the free layer and configured to apply an external magnetic field to the free layer, wherein a magnetization direction of the free layer is switchable by application of the Rashba field and the external magnetic field to the free layer.

The free layer and the pinned layer may have perpendicular magnetic anisotropy.

The magnetic memory device may be configured to apply a first current to the first conductive line to induce the Rashba field, and the second conductive line may be configured to apply the external magnetic field to the free layer in a direction identical to a direction of the first current.

The first conductive line may be configured to apply the Rashba field to the free layer in a first direction, and the second conductive line may be configured to apply the external magnetic field to the free layer in a second direction which is perpendicular to the first direction.

The magnetoresistive element may have a bottom-pinned structure in which the pinned layer is under the free layer, the first conductive line may be on an upper surface of the magnetoresistive element, and the second conductive line may be under the magnetoresistive element.

The magnetoresistive element may have a top-pinned structure in which the pinned layer is above the free layer, the first conductive line may be on a lower surface of the magnetoresistive element, and the second conductive line may be under the first conductive line.

The first conductive line may be a bit line, and the second conductive line may be a word line.

The first conductive line and the second conductive line may cross each other, and the magnetoresistive element may be at an intersection point of the first conductive line and the second conductive line.

The magnetic memory device may further include a switching device connected to the magnetoresistive element.

The second conductive line may be a part of the switching device.

The switching device may include a transistor, and the second conductive line may be a gate line of the transistor.

The transistor may include a drain connected to the pinned layer.

The switching device may include a first transistor and a second transistor, a first magnetoresistive element is on the first transistor, and a second magnetoresistive element is on the second transistor. The first conductive line may be commonly connected to the first and second magnetoresistive elements.

The first transistor may include a first gate line, and the second transistor may include a second gate line, wherein each of the first and second gate lines corresponds to the second conductive line.

The first magnetoresistive element may be on the first gate line, the second magnetoresistive element may be on the second gate line, and the first conductive line may be on the first and second magnetoresistive elements.

The first magnetoresistive element may be on the first gate line, the second magnetoresistive element may be on the second gate line, and the first conductive line may be interposed between the first and second gate lines and the first and second magnetoresistive elements.

The first and second transistors may be both connected to a single source.

The magnetic memory device may further include a magnetic field focusing element configured to focus the external magnetic field on the magnetoresistive element.

The magnetic field focusing element may include a cladding layer on side walls of the second conductive line.

The cladding layer may include a magnetic material containing at least one of Ni, Co, and Fe.

According to example embodiments, a magnetic memory device includes a transistor including a source, a drain, and a gate; a magnetoresistive element that is connected to the transistor and includes a free layer, a pinned layer, and a separation layer interposed between the free layer and the pinned layer; and a bit line connected to the magnetoresistive element, wherein the bit line is configured to induce a Rashba field in the free layer, the gate is configured to apply an external magnetic field to the free layer, and a magnetization direction of the free layer is switchable by the Rashba field and the external magnetic field.

The bit line may be connected to the free layer.

The drain may be connected to the pinned layer.

The magnetoresistive element may be above the gate.

The gate may have a line shape crossing the bit line, and the magnetoresistive element may be at an intersection point of the gate and the bit line.

The magnetoresistive element may have a bottom-pinned structure in which the pinned layer is under the free layer, the bit line may be on an upper surface of the magnetoresistive element, and the gate may be under the magnetoresistive element.

The magnetoresistive element may have a top-pinned structure in which the pinned layer is above the free layer, the bit line may be on a lower surface of the magnetoresistive element, and the gate may be under the bit line.

The free layer and the pinned layer may have perpendicular magnetic anisotropy.

According to other example embodiments, a method of operating a magnetic memory device including a magnetoresistive element including a free layer, a pinned layer and a separation layer therebetween, a first conductive line connected to the free layer, and a second conductive line spaced apart from the free layer, includes writing data on the magnetoresistive element, wherein the writing of data includes applying a Rashba field to the free layer by providing a first current to the first conductive line; and applying an external magnetic field to the free layer by providing a second current to the second conductive line.

The free layer and the pinned layer may have perpendicular magnetic anisotropy.

The free layer may have a magnetization direction extending in a first direction, prior to applying the Rashba field and the external magnetic field, and the magnetization direction of the free layer may be switched to extend in a second direction by applying the Rashba field and the external magnetic field, and one of the first direction and the second direction is an upward direction, and the other one of the first direction and the second direction is an downward direction.

The external magnetic field may be applied to the free layer in a direction that is identical to a direction of the first current.

The Rashba field may be applied to the free layer in a first direction, and the external magnetic field may be applied to the free layer in a second direction perpendicular to the first direction.

The method may further include applying a second Rashba field to the free layer by providing a third current to the first conductive line, the third current having a direction opposite to that of the first current; and applying a second external magnetic field to the free layer by providing a fourth current to the second conductive line, the fourth current having a direction opposite to that of the second current.

The magnetic memory device may further include a switching device connected to the magnetoresistive element, and the second conductive line may be a part of the switching device.

The switching device may include a transistor, and the second conductive line may be a gate line of the transistor.

BRIEF DESCRIPTION OF THE DRAWINGS

Example embodiments will be more clearly understood from the following detailed description taken in conjunction with the accompanying drawings. FIGS. 1-10 represent non-limiting, example embodiments as described herein.

FIGS. 1 through 4 are perspective views of magnetic memory devices according to example embodiments;

FIGS. 5 through 8 are perspective views illustrating overall detailed structures of the magnetic memory devices of FIGS. 1 through 4, according to example embodiments;

FIG. 10 is a perspective view for explaining a data read method of a magnetic memory device according to example embodiments.

DETAILED DESCRIPTION

Figure 1:
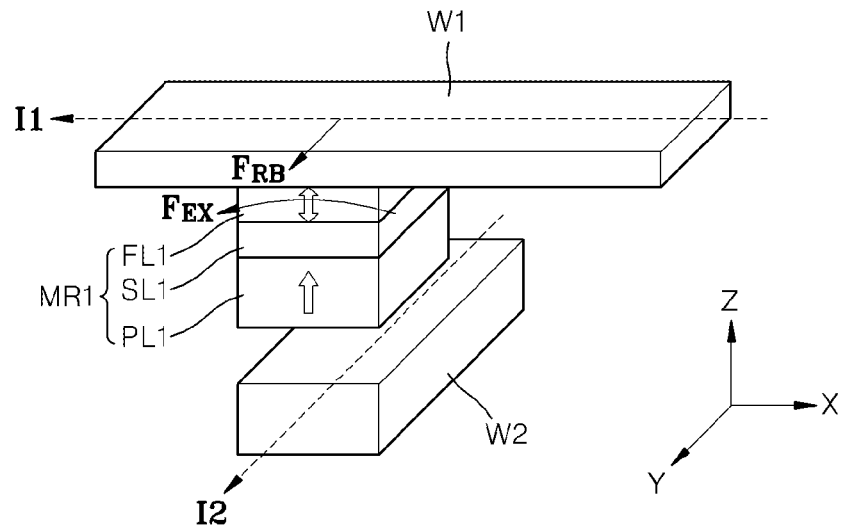

Various example embodiments will now be described more fully with reference to the accompanying drawings in which some example embodiments are shown. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments relate to magnetic memory devices and methods of operating the same.

FIG. 1 is a perspective view of a magnetic memory device according to example embodiments.

Referring to FIG. 1, a magnetoresistive element MR1 may be provided. The magnetoresistive element MR1 may include a free layer FL1, a pinned layer PL1, and a separation layer SL1 between the free layer FL1 and the pinned layer PL1. The free layer FL1 may be a magnetic layer having a variable (changeable) magnetization direction, and may be formed of a ferromagnetic material. The ferromagnetic material may include at least one of Co, Fe, and Ni, and may further include at least one other element, for example, B, Cr, Pt, Pd, or the like. The pinned layer PL1 may be a magnetic having a fixed magnetization direction, and may be formed of a ferromagnetic material including at least one of Co, Fe, and Ni, for example. The ferromagnetic material may further include at least one other element, for example, B, Cr, Pt, Pd, or the like, in addition to Co, Fe, and Ni. The free layer FL1 and the pinned layer PL1 may be formed of different, or identical, materials. The free layer FL1 and the pinned layer PL1 may each have perpendicular magnetic anisotropy. In this case, the free layer FL1 and/or the pinned layer PL1 may include a Co-based material, and may include a single-layered or a multi-layered structure. For example, the free layer FL1 and/or the pinned layer PL1 may include at least one selected from the group consisting of Co, CoFe, CoFeB, CoCr, and CoCrPt, or may have a $[Co/Pd]_n$ structure, a $[Co/Ni]_n$ structure, or a $[Co/Pt]_n$ structure. In the $[Co/Pd]_n$ structure, n refers to the repeating number of the stack of Co and Pd, wherein Co and Pd are alternately stacked. N of $[Co/Ni]_n$ and $[Co/Pt]_n$ is the same as described above. The materials for forming the free layer FL1 and the pinned layer PL1 are merely examples, and, various other materials may also be used to form the free layer FL1 and the pinned layer PL1. The separation layer SL1 may be formed of an insulating material. For example, the separation layer SL1 may include an insulating oxide, such as an Mg oxide and an Al oxide. When these materials, in particular, the Mg oxide, is used to form the separation layer SL1, a magnetoresistance ratio (that is, MR ratio) may increase. A thickness of the separation layer SL1 may be about 5 nm or less, for example, about 3 nm or less. In the present example embodiments, the separation layer SL1 and the free layer FL1 may be sequentially stacked on the pinned layer PL1. That is, in the present example embodiments, the magnetoresistive element MR1 has a bottom pinned structure wherein the pinned layer PL1 is disposed under the free layer FL1.

A first conductive line W1 for inducing a Rashba field $F_{RB}$ in the free layer FL1 may be provided. The first conductive line W1 may be connected to the free layer FL1. The first conductive line W1 may be disposed on the free layer FL1 and may contact the free layer FL1. The first conductive line W1 may extend in a predetermined (or, alternatively, selected) direction, for example, an X-axis direction. The first conductive line W1 may be formed of a metal that has strong spin orbit coupling, and an example of such a metal is Pt and/or Pd. A top surface of the free layer FL1 contacts the first conductive line W1, and a bottom surface of the free layer FL1 contacts the separation layer SL1. The first conductive line W1 may be formed of a metal that has strong spin orbit coupling, and the separation layer SL1 may be formed of an insulating material. Accordingly, an interfacial state between the free layer FL1 and the first conductive line W1 may be different from an interfacial state between the free layer FL1 and the separation layer SL1. In this case, due to a current (hereinafter referred to as a first current I1) flowing through the first conductive line W1, a Rashba field $F_{RB}$ may be applied to the free layer FL1. In more detail, when the first current I1 is supplied to the first conductive line W1, due to an asymmetric electronic structure between a first interface of the free layer FL1 with the separation layer SL1 and a second interface of the free layer FL1 with the first conductive line W1, an effective electric field may occur between the first interface and the second interface. The electric field causes an effective magnetic field in the free layer FL1. This magnetic field is the Rashba field $F_{RB}$. The Rashba field $F_{RB}$ may be applied in a direction perpendicular to a direction of the first current I1. When the first current I1 is applied in a reverse X-axis direction, the Rashba field $F_{RB}$ may be applied in a Y-axis direction. The Rashba field $F_{RB}$ effectively operates only inside the free layer FL1, and may hardly affect the outside of the free layer FL1.

A second conductive line W2 for applying an external magnetic field $F_{EX}$ to the free layer FL1 may be provided. In this regard, the terminology "external magnetic field" means a field applied from outside the free layer FL1 to the free layer FL1 (or, alternatively, the terminology "external magnetic field" means a field applied without providing, or supplying, a direct current through the magnetoresistive element MR1). The second conductive line W2 for generating the external magnetic field $F_{EX}$ may be spaced apart from the magnetoresistive element MR1. For example, the second conductive line W2 may be spaced apart from the pinned layer PL1 under the pinned layer PL1. The second conductive line W2 may extend in a selected direction, for example, the Y-axis direction. Accordingly, the second conductive line W2 may be disposed to cross the first conductive line W1. The magnetoresistive element MR1 may be located at a point of intersection where the second conductive line W2 crosses the first conductive line W1. When a current (hereinafter referred to as "a second current I2") is applied to the second conductive line W2, the external magnetic field $F_{EX}$ may occur from the second conductive line W2. The external magnetic field $F_{EX}$ may be applied to the free layer FL1. When the second current I2 is applied in the Y-axis direction, the external magnetic field $F_{EX}$ in the free layer FL1 may have a reverse X-axis direction or a direction similar thereto. A direction of the external magnetic field $F_{EX}$ in the free layer FL1 may be perpendicular to the direction of the Rashba field $F_{RB}$, or may be substantially similar to the perpendicular direction. In addition, the direction of the external magnetic field $F_{EX}$ applied to the free layer FL1 may be identical, or similar, to the direction of the first current I1 applied to the first conductive line W1 to induce the Rashba field $F_{RB}$.

A magnetization direction of the free layer FL1 may be switched by the Rashba field $F_{RB}$ and the external magnetic field $F_{EX}$. Due to the Rashba field $F_{RB}$ and the external magnetic field $F_{EX}$ which are perpendicular to each other, the magnetization (that is, a magnetic moment) of the free layer FL1 may be perturbed, and the axis of magnetization (that is, magnetic moment) may rotate on a particular orbital. The rotating of the axis of the magnetization (that is, magnetic moment) on a particular orbital is referred to as a precession. While the precession of the magnetization of the free layer FL1, the direction of magnetization may be switched to (or, alternatively, in) a perpendicular direction. If the free layer FL1 is magnetized in a Z-axis direction, due to the Rashba field $F_{RB}$ and the external magnetic field $F_{EX}$, the magnetization direction of the free layer FL1 may be switched to a reverse Z-axis direction.

The directions of the Rashba field $F_{RB}$ and the external magnetic field $F_{EX}$ illustrated in FIG. 1 are examples, and may vary. According to the direction of the first current I1, the direction of the Rashba field $F_{RB}$ may vary, and according to the direction of the second current I2, the direction of the external magnetic field $F_{EX}$ may vary. When the first current I1 is applied in the X-axis direction, the Rashba field $F_{RB}$ may occur in a reverse Y-axis direction. When the second current I2 is applied in the reverse Y-axis direction, the external magnetic field $F_{EX}$ may be applied in the X-axis direction or in a direction similar thereto. As such, when the directions of the Rashba field $F_{RB}$ and the external magnetic field $F_{EX}$ are opposite to those illustrated in FIG. 1, the magnetization of the free layer FL1 may be switched from a reverse Z-axis direction to a Z-axis direction. As described above, in the present example embodiments, the magnetization of the free layer FL1 may be switched to (or, alternatively, in) a perpendicular direction by using the Rashba field $F_{RB}$ and the external magnetic field $F_{EX}$.

In a typical STT-MRAM, a magnetization direction of a free layer is switched by using a current flowing through a magnetoresistive element (that is, an MTJ element). Accordingly, a separation layer (that is, a tunneling layer) of the magnetoresistive element (that is, MTJ element) needs to have very high endurance. Also, because ranges of a writing voltage (that is, a switching voltage) and a read voltage need to be determined within a voltage range in which the separation layer (that is, a tunneling layer) is not broken down, there are many limitations to set a range of an operation voltage (i.e., writing voltage and read voltage). When a distribution (range) of the writing voltage and a distribution (range) of the read voltage are close to a distribution (range) of a breakdown voltage of the separation layer (tunneling layer), an operation error, such as a writing error, and reliability related problems may occur. To suppress these problems, the distribution (range) of the writing voltage, the distribution (range) of the read voltage, and the distribution (range) of the breakdown voltage need to be strictly managed (controlled). These problems may make commercialization of STT-MRAM difficult.

However, in the present example embodiments, a current does not flow through the magnetoresistive element MR1, and the first and second currents I1 and I2 are applied to only the first and second conductive lines W1 and W2 to switch a magnetization direction of the free layer FL1. That is, in the present example embodiments, a current for switching the magnetization direction of the free layer FL1, that is, the first and second currents I1 and I2 do not flow through the magnetoresistive element MR1. Accordingly, in the present embodiment, any damage to the separation layer SL1 (that is, a tunneling layer) of the magnetoresistive element MR1 by a switching current (that is, a writing current) or deterioration of characteristics of the separation layer SL1 may be prevented. Accordingly, endurance requirement conditions with respect to the separation layer SL1 (that is, a tunneling layer) may be relieved, and deterioration of characteristics of the magnetoresistive element MR1 by the writing current may be prevented. In addition, although a read current may be applied to flow through the magnetoresistive element MR1, the intensity (magnitude) of the read current is much lower than that of the writing current of a typical STT-MRAM, the damage to the separation layer SL1 (that is, a tunneling layer) by the read current or deterioration of the separation layer SL1 by the read current may not occur. Also, in the present embodiment, since the writing current does not flow through the magnetoresistive element MR1, there is no need to consider a distribution (range) of a writing voltage with respect to the magnetoresistive element MR1. That is, regarding the magnetoresistive element MR1, only the distribution (range) of a read voltage and the distribution (range) of a breakdown voltage may be taken into consideration. Accordingly, requirements for the management of the operation voltage are relieved, and a range of the operation voltage may be freely set, and the possibility of occurrence of an operation error may be lowered. Thus, a device structure according to example embodiments may be advantageous for commercialization of an MRAM.

Additionally, in the case of a typical MRAM in which a magnetization direction of a free layer is switched by using a digit line and a bit line, the use of an MTJ element having a horizontal magnetization and a complicated structure make it difficult to realize high-densification. In addition, in the typical MRAM, even a cell adjacent to a target cell that is to be switched may be switched or half-switched. This phenomenon is referred to as a cross talk. However, in the case of a magnetic memory device according to example embodiments, a magnetoresistive element MR1 having a perpendicular magnetization is used and also, the magnetic memory device has a more simplified structure than the typical MRAM. Thus, the magnetic memory device according to example embodiments is suitable for high densification and high integration. Also, in a magnetic memory device according to example embodiments, the Rashba field $F_{RB}$ affects only inside the free layer FL1, and does not affect outside the free layer FL1. Accordingly, the cross talk may be prevented or suppressed.

The structure illustrated in FIG. 1 may be variously modified. For example, the structure of FIG. 1 may be modified to the structure of FIG. 2.

Figure 2:
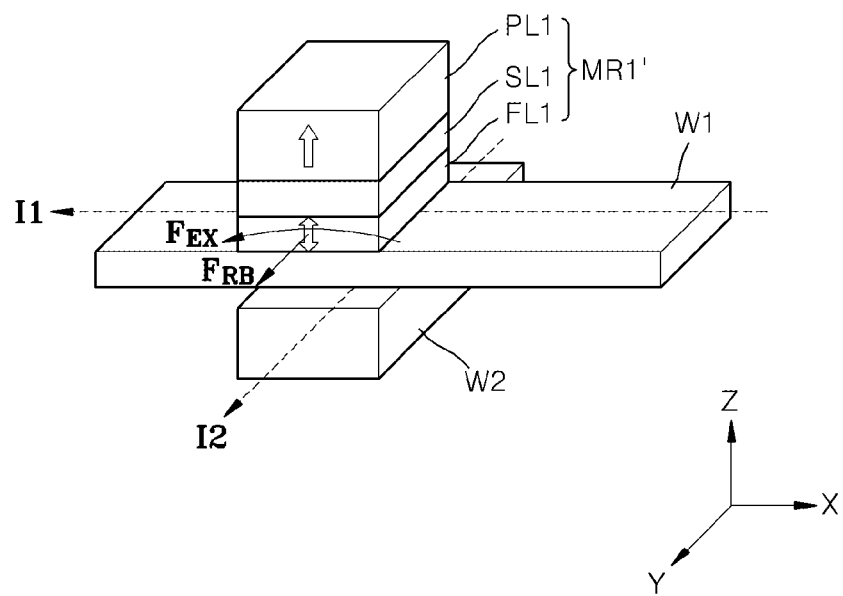

Referring to FIG. 2, a magnetoresistive element MR1' may have a top-pinned structure in which the pinned layer PL1 is located above the free layer FL1. That is, the magnetoresistive element MR1' may include the separation layer SL1 and the pinned layer PL1 which are sequentially stacked on the free layer FL1 in this stated order. In this case, the first conductive line W1 may contact a lower surface of the magnetoresistive element MR1', that is, a lower surface of the free layer FL1. The second conductive line W2 may be spaced apart from the first conductive line W1 under the first conductive line W1. The first conductive line W1 and the second conductive line W2 may cross each other. The magnetoresistive element MR1' may be located at a point of intersection where the first conductive line W1 and the second conductive line W2 cross each other. In this regard, although the magnetoresistive element MR1' is not located between the first conductive line W1 and the second conductive line W2, the magnetoresistive element MR1' is provided to be located to correspond to the intersection point of the first conductive line W1 and the second conductive line W2.

Even in the structure of FIG. 2, the magnetization direction of the free layer FL1 may be switched by the Rashba field $F_{RB}$ generated by the first conductive line W1 and the external magnetic field $F_{EX}$ generated by the second conductive line W2. In particular, in the structure of FIG. 2, a distance between the free layer FL1 and the second conductive line W2 may be shorter than that of the structure of FIG. 1. Accordingly, in the structure of FIG. 2, the external magnetic field $F_{EX}$ generated by the second conductive line W2 may be applied in a stronger intensity to the free layer FL1. Accordingly, an amount of a current that is required to generate the external magnetic field $F_{EX}$ for switching may be reduced. That is, the intensity of the second current I2 applied to the second conductive line W2 to generate the external magnetic field $F_{EX}$ may be lowered.

Figure 3:
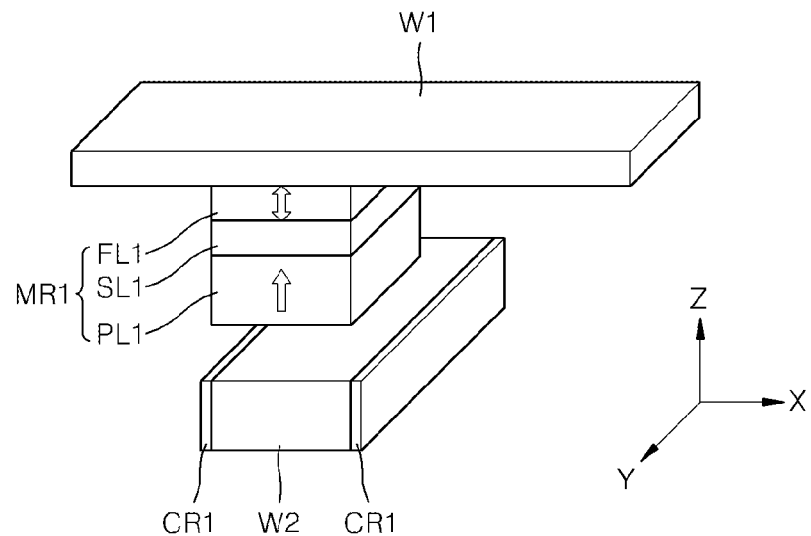
Figure 4:
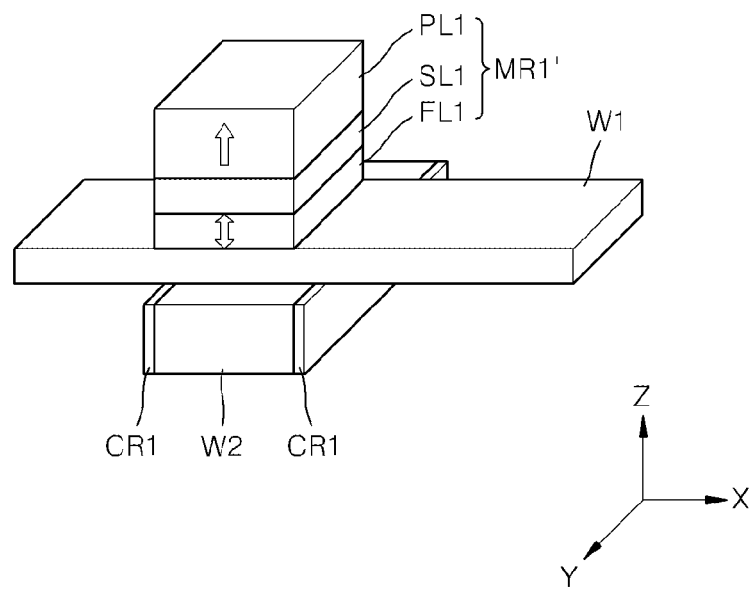

The structures of FIGS. 1 and 2 may further include an element for focusing the external magnetic field $F_{EX}$ on the free layer FL1 (that is, a magnetic field focusing element). The magnetic field focusing element may include a cladding layer CR1 provided on side walls of the second conductive line W2. FIGS. 3 and 4 are perspective views of the structures of FIGS. 1 and 2 including the cladding layer.

Referring to FIGS. 3 and 4, the cladding layer CR1 may be provided on side walls of the second conductive line W2. The cladding layer CR1 may be formed of a magnetic material including at least one of Ni, Co, and Fe. For example, the cladding layer CR1 may be a NiFe layer, a Co layer, a Fe layer, or the like. The cladding layer CR1 may guide a magnetic flux generated from the second conductive line W2. Accordingly, an external magnetic field ($F_{EX}$ of FIGS. 1 and 2) occurring in the second conductive line W2 may also be focused on the free layer F1 by the cladding layer CR1. In addition, the cladding layer CR1 may lead to an increase in the intensity of the external magnetic field ($F_{EX}$ of FIGS. 1 and 2). Accordingly, when the cladding layer CR1 is included, the magnetization direction of the free layer F1 may be easily switched.

The magnetic memory devices of FIGS. 1 through 4 may further include a switching device (not shown) connected to the magnetoresistive elements MR1 and MR1'. In this case, the second conductive line W2 may be a part of the switching device. That is, a part of the switching device may be used as the second conductive line W2. When the magnetic memory devices of FIGS. 1 through 4 further include a switching device, the resultant structures are illustrated in FIGS. 5 through 8.

FIGS. 5 through 8 illustrate detailed structures of magnetic memory devices according to example embodiments.

Figure 5:
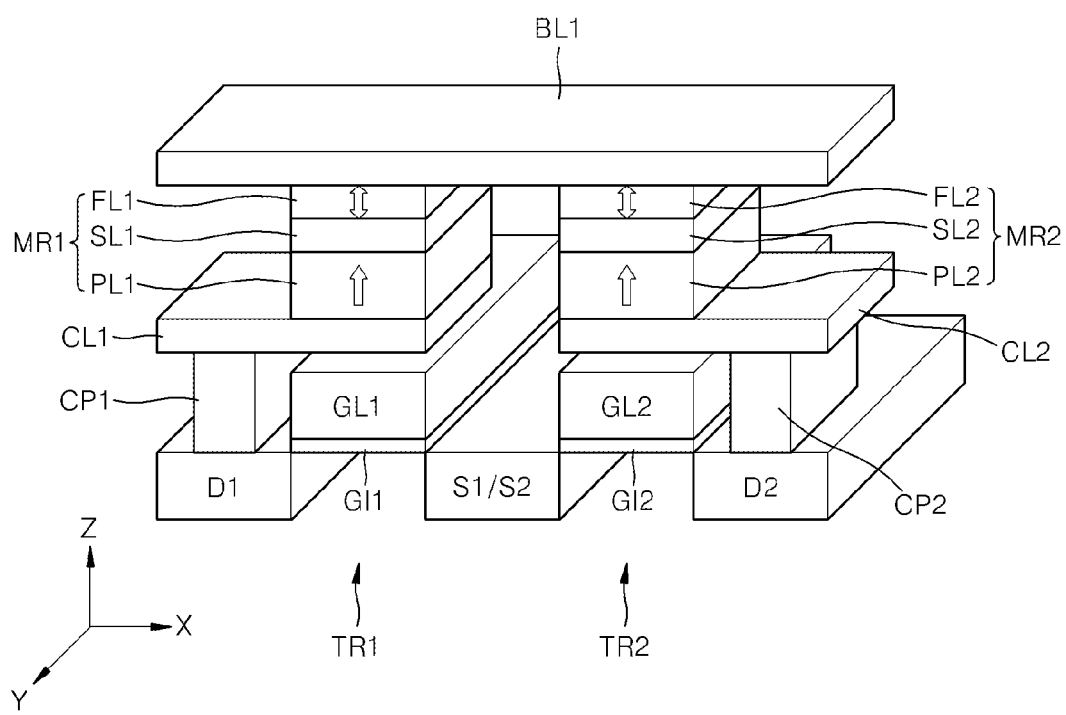

Referring to FIG. 5, at least one transistor, for example, a first transistor TR1 and a second transistor TR2 may be provided on a substrate (not shown). The first transistor TR1 may include a first source S1, a first drain D1, and a first gate line GL1. Although not illustrated, a first channel region may be disposed between the first source S1 and the first drain D1. A first gate line GL1 may be disposed on the first channel region. A first gate insulating layer GI1 may be disposed between the first channel region and the first gate line GL1. The second transistor TR2 may have a structure that is identical or similar to that of the first transistor TR1. That is, the second transistor TR2 may include a second source S2, a second drain D2, and a second gate line GL2. A second channel region (not shown) may be disposed between the second source S2 and the second drain D2. A second gate line GL2 may be disposed on the second channel region. A second gate insulating layer GI2 may be disposed between the second channel region and the second gate line GL2. In the present example embodiments, the first source S1 and the second source S2 may refer to a same region. That is, the first and second transistors TR1 and TR2 may share (or, alternatively, both may be connected to) one source S1/S2. Accordingly, the source S1/S2 may be referred to as a 'common source'. The first drain D1 and the second drain D2 may be spaced apart from each other with the common source S1/S2 interposed therebetween. In addition, the first gate line GL1 may be referred to as a first word line, and the second gate line GL2 may be referred to as a second word line. The first and second gate lines GL1 and GL2 may extend in a Y-axis direction.

A first magnetoresistive element MR1 may be disposed on (above) the first transistor TR1. The first magnetoresistive element MR1 may be disposed on (above) the first gate line GL1. The first transistor TR1 may be connected to the first magnetoresistive element MR1. The first drain D1 of the first transistor TR1 may be connected to a lower surface of the first magnetoresistive element MR1. The first drain D1 and the lower surface of the first magnetoresistive element MR1 may be connected to each other through a first connection plug CP1 and a first connection layer CL1. A second magnetoresistive element MR2 may be disposed on (above) the second transistor TR2. The second magnetoresistive element MR2 may be disposed on (above) the second gate line GL2. The second transistor TR2 may be connected to the second magnetoresistive element MR2. The second drain D2 of the second transistor TR2 may be connected to a lower surface of the second magnetoresistive element MR2. The second drain D2 and the lower surface of the second magnetoresistive element MR2 may be connected to each other through a second connection plug CP2 and a second connection layer CL2. The connection structure of the first magnetoresistive element MR1 and the first transistor TR1 and the connection structure of the second magnetoresistive element MR2 and the second transistor TR2 may be symmetric about the common source S1/S2.

The first and second magnetoresistive elements MR1 and MR2 may have the same structure as that of the magnetoresistive element MR1 of FIG. 1. The first magnetoresistive element MR1 may include the first separation layer SL1 and the first free layer FL1 which are sequentially stacked on the first pinned layer PL1, and the second magnetoresistive element MR2 may include the second separation layer SL2 and the second free layer FL2 which are sequentially stacked on the second pinned layer PL2. That is, the first and second magnetoresistive elements MR1 and MR2 each may have a bottom-pinned structure.

A bit line BL1 may be disposed on the first and second magnetoresistive elements MR1 and MR2. The bit line BL1 may be commonly connected to the first and second magnetoresistive elements MR1 and MR2. The bit line BL1 may commonly contact the first and second free layers FL1 and FL2. The bit line BL1 may extend in an X-axis direction. Accordingly, the bit line BL1 may extend to cross the first and second gate lines GL1 and GL2. At a point of intersection of the bit line BL1 and the first and second gate lines GL1 and GL2, the first and second magnetoresistive elements MR1 and MR2 may be located.

The bit line BL1 of FIG. 5 may correspond to the first conductive line W1 of FIG. 1, and the first and second gate lines GL1 and GL2 of FIG. 5 may correspond to the second conductive line W2 of FIG. 1. Accordingly, in the structure of FIG. 5, a magnetization direction of a first free layer FL1 may be switched by a Rashba field generated in the first free layer FL1 by the bit line BL1 and an external magnetic field that is applied to the first free layer FL1 by the first gate line GL1. Likewise, a magnetization direction of a second free layer FL2 may be switched by a Rashba field generated in the second free layer FL2 by the bit line BL1 and an external magnetic field that is applied to the second free layer FL2 by the second gate line GL2. A data writing method using the Rashba field and the external magnetic field will be described in detail below with reference to FIGS. 9A to 9D.

Figure 6:
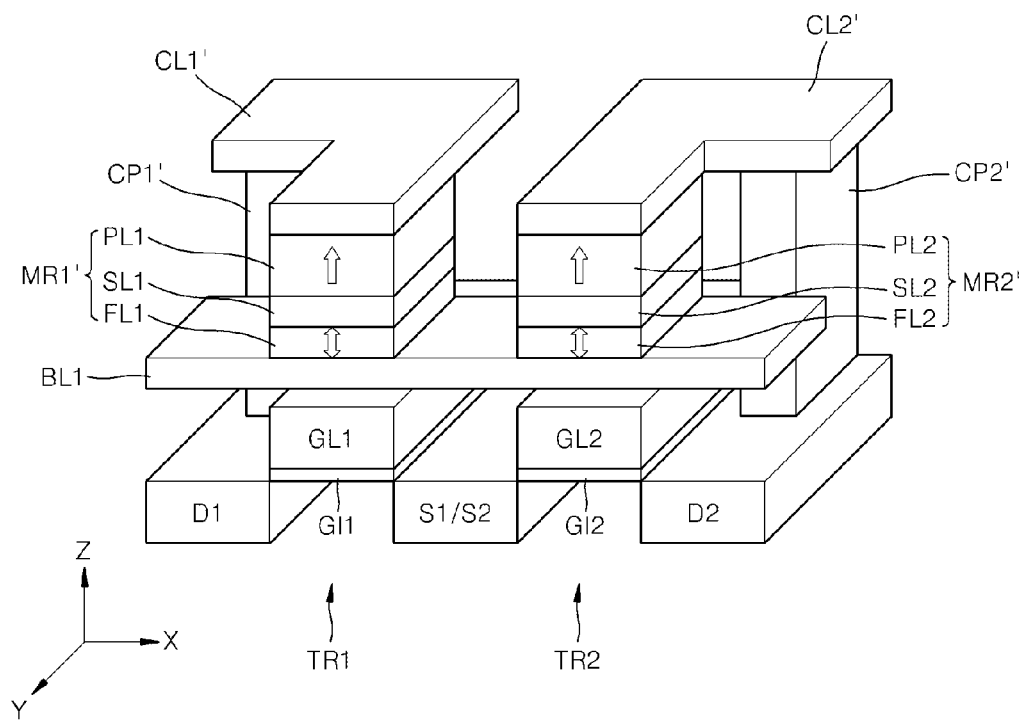

FIG. 6 is a perspective view of a magnetic memory device according to further example embodiments. The magnetic memory device according to present example embodiments is modified from the structure of FIG. 5.

Referring to FIG. 6, like the magnetic memory device of FIG. 5, the magnetic memory device according to the present example embodiments may include the first and second transistors TR1 and TR2. First and second magnetoresistive elements MR1' and MR2' may be respectively disposed on (above) the first and second transistors TR1 and TR2. The first and second magnetoresistive elements MR1' and MR2' may each have a top-pinned structure. That is, the first magnetoresistive element MR1' may include the first separation layer SL1 and the first pinned layer PL1 which are sequentially stacked on the first free layer FL1, and the second magnetoresistive element MR2' may include the second separation layer SL2 and the second pinned layer PL2 which are sequentially stacked on the second free layer FL2. In this case, the first and second drains D1 and D2 may be connected to upper surfaces of the first and second magnetoresistive elements MR1' and MR2', respectively. The first drain D1 may be connected to the upper surface of the first pinned layer PL1 through a first connection plug CP1' and a first connection layer CL1'. The second drain D2 may be connected to the upper surface of the second pinned layer PL2 through a second connection plug CP2' and a second connection layer CL2'. The first connection layer CL1' and the second connection layer CL2' may each have a bent structure. In addition, the bit line BL1 may be disposed under the first and second magnetoresistive element MR1', MR2'. The bit line BL1 may contact lower surfaces of the first and second free layers FL1 and FL2. The first and second gate lines GL1 and GL2 may be spaced apart from the bit line BL1 under the bit line BL1. Accordingly, the bit line BL1 may be disposed between the gate lines GL1 and GL2 and the magnetoresistive elements MR1' and MR2'. The first and second magnetoresistive elements MR1' and MR2' may be located at a point of intersection where the bit line BL1 crosses the first and second gate lines GL1 and GL2.

In the magnetic memory device of FIG. 6, the first and second magnetoresistive elements MR1' and MR2' may correspond to the magnetoresistive element MR1' of FIG. 2. In addition, the bit line BL1 and gate lines GL1 and GL2 of FIG. 6 may respectively correspond to the first conductive line W1 and the second conductive line W2 of FIG. 2. Even in the structure of FIG. 6, magnetization directions of the free layers FL1 and FL2 may be switched by a Rashba field that is generated in the free layers FL1 and FL2 by the bit line BL1 and an external magnetic field that is applied to the free layers FL1 and FL2 by the gate lines GL1 and GL2.

In the structure of FIG. 6, distances between the free layers FL1 and FL2 and the corresponding gate lines GL1 and GL2 may be shorter than that of FIG. 5. Accordingly, in the structure of FIG. 6, external magnetic fields generated by the first and second gate lines GL1 and GL2 may be applied having high amplitudes to the corresponding free layers FL1 and FL2. Accordingly, the magnitude of a current that is required to generate an external magnetic field for switching may decrease. That is, the magnitude of a current applied to the first and second gate lines GL1 and GL2 to generate the external magnetic field may decrease.

The structures of FIGS. 5 and 6 may further include an element for focusing the external magnetic field generated by the first and second gate lines GL1 and GL2 on the corresponding free layers FL1 and FL2 (that is, a magnetic field focusing element). The magnetic field focusing element may include a cladding layer CR1/CR2 provided on side walls of the first and second gate lines GL1 and GL2.

Figure 7:
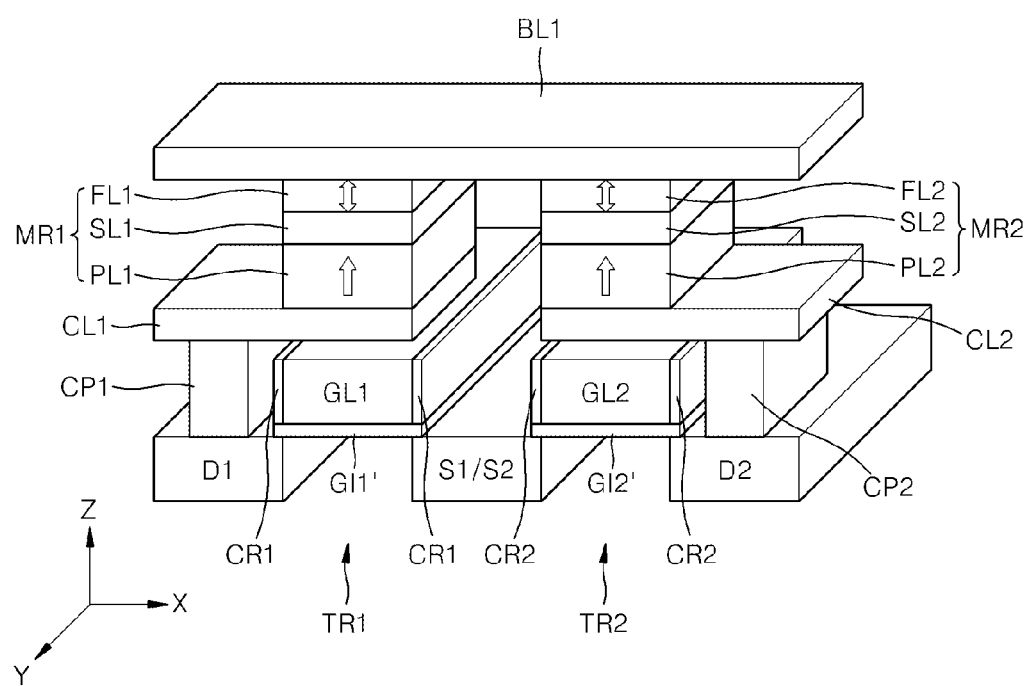
Figure 8:
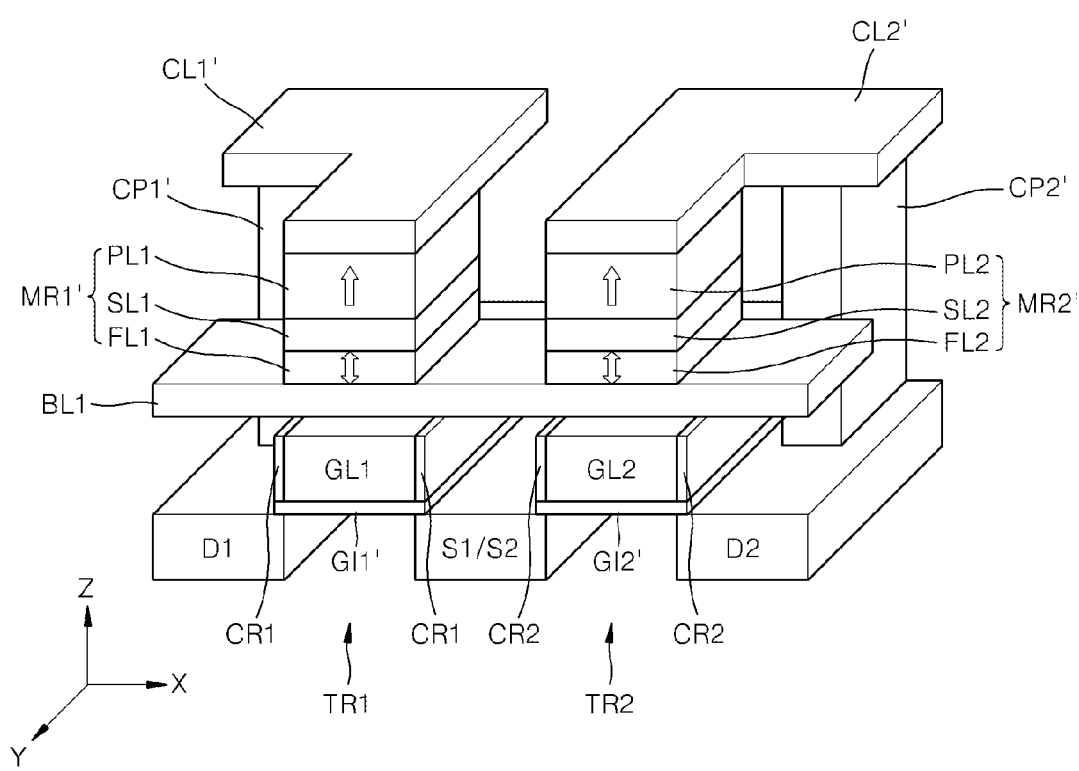

FIGS. 7 and 8 are perspective views of the structures of FIGS. 5 and 6 including the cladding layer.

Referring to FIGS. 7 and 8, a first cladding layer CR1 may be disposed on side walls of the first gate line GL1, and a second cladding layer CL2 may be disposed on side walls of the second gate line GL2. The first and second cladding layers CL1 and CL2 may be formed of a magnetic material including at least one of Ni, Co, and Fe. For example, the first and second cladding layers CL1 and CL2 may each be a NiFe layer, a Co layer, a Fe layer, or the like. The external magnetic field generated by the first gate line GL1 may be focused on the first free layer FL1 by the first cladding layer CR1. The external magnetic field generated by the second gate line GL2 may be focused on the second free layer FL2 by the second cladding layer CR2. In addition, the first and second cladding layers CR1 and CR2 may lead to an increase in the amplitude of the external magnetic field. Accordingly, when the first cladding layers CR1 and CR2 are provided, magnetization directions of the free layers FL1 and FL2 may be easily switched. When the cladding layers CR1 and CR2 are included as illustrated in FIGS. 7 and 8, a first gate insulating layer GI1' may be disposed under the first gate line GL1 and the first cladding layers CR1 on both sides of first gate line GL1, and a second gate insulating layer GI2' may be disposed under the second gate line GL2 and the second cladding layer CR2 on both sides of the second gate line GL2. The magnetic memory devices of FIGS. 7 and 8 are the same as the magnetic memory devices of FIGS. 5 and 6, except that the cladding layers CR1 and CR2 are additionally formed and the gate insulating layers GI1' and GI2' are somewhat modified.

Regarding the magnetic memory devices of FIGS. 5 through 8, the gate lines GL1 and GL2 of the transistors TR1 and TR2 are used as conductive lines for generating an external magnetic field required for data writing (that is, switching of magnetization direction). Accordingly, the structure of the magnetic memory devices may be simplified. In a typical MRAM, because a separate digit line is disposed under an MTJ element, the structure of a manufactured memory device is complicated and the manufacturing process therefor may also be complicated. However, in the present example embodiments, the gate lines GL1 and GL2 are used as a conductive line for generating an external magnetic field. Accordingly, a separate digit line is not needed, and due to the absence of the digit line, simplification in terms of structure and process may be achieved. To use the gate lines GL1 and GL2 as the conductive line for generating the external magnetic field, the gate lines GL1 and GL2 may be formed of an excellent conductive material, such as metal.

When an external magnetic field is generated by using the first and second gate lines GL1 and GL2 to perform data writing, a selected voltage may be applied to a substrate (not shown) so as not to turn on the first and second transistors TR1 and TR2. That is, without turning-on the first and second transistors TR1 and TR2, a current may be provided to the first and second gate lines GL1 and GL2 to generate an external magnetic field. In other words, when an external magnetic field is generated by the first and second gate lines GL1 and GL2, the first and second gate lines GL1 and GL2 may not operate having a gating function. Meanwhile, during data read, the first and second gate lines GL1 and GL2 may be used for ON/OFF of the first and second transistors TR1 and TR2. For example, referring to FIG. 5, when a selected voltage is applied to the first gate line GL1 to turn on the first transistor TR1 and then, a read current is provided between the first transistor TR1 and the bit line BL1, data written on the first magnetoresistive element MR1 may be read. In this regard, although the read current flows through the first magnetoresistive element MR1, due to the low intensity of the read current, a magnetization direction of the free layer FL1 may not be changed by the read current. As described above, the first and second transistors TR1 and TR2 may be selectively driven during the data read.

Hereinafter, a method of operating a magnetic memory device, according to example embodiments, is described in detail.

FIGS. 9A through 9D are perspective views for explaining a data writing method of a magnetic memory device, according to example embodiments. The method according to the present example embodiments relates to the magnetic memory device of FIG. 5.

Figure 9A:
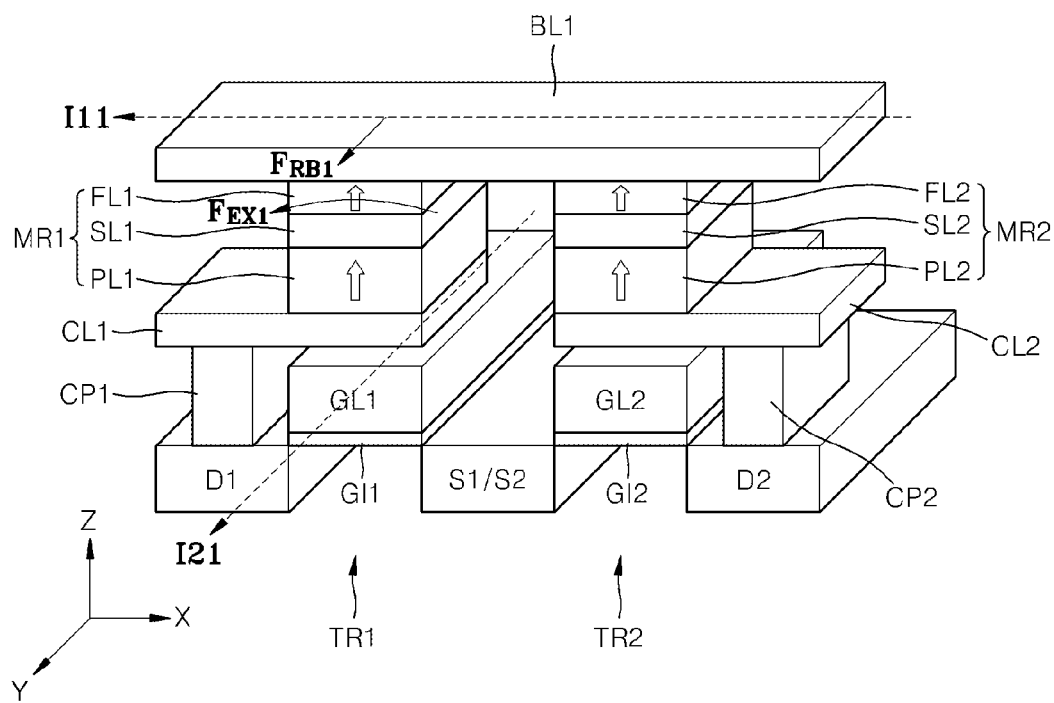
FIGS. 9A through 9D are perspective views for explaining a data writing method of a magnetic memory device according to example embodiments.

Referring to FIG. 9A, a magnetic memory device having the structure of FIG. 5 is provided. In this regard, the first and second free layers FL1 and FL2 may be magnetized in a Z-axis direction. A first current I11 may be applied to the bit line BL1 to cause a Rashba field $F_{RB1}$ in the first free layer FL1. When the first current I11 is provided to the bit line BL1 in a reverse X-axis direction, the Rashba field $F_{RB1}$ may be applied in a Y-axis direction. Another Rashba field (not shown) which is the same as the Rashba field $F_{RB1}$ may occur even in the second free layer FL2. A second current I21 may be provided to the first gate line GL1 to generate an external magnetic field $F_{EX1}$ from the first gate line GL1. The external magnetic field $F_{EX1}$ may be applied to the first free layer FL1. When the second current I21 is provided in a Y-axis direction, the external magnetic field $F_{EX1}$ may be applied to the first free layer FL1 in a reverse X-axis direction or in a direction similar thereto. Accordingly, in the first free layer FL1, the application direction of the external magnetic field $F_{EX1}$ may be perpendicular to that of the Rashba field $F_{RB1}$, or may be similar to the perpendicular direction. In the first free layer FL1, the application direction of the external magnetic field $F_{EX1}$ may be identical or similar to the direction of the first current I11 provided to the bit line BL1 to induce the Rashba field $F_{RB1}$.

Figure 9B:
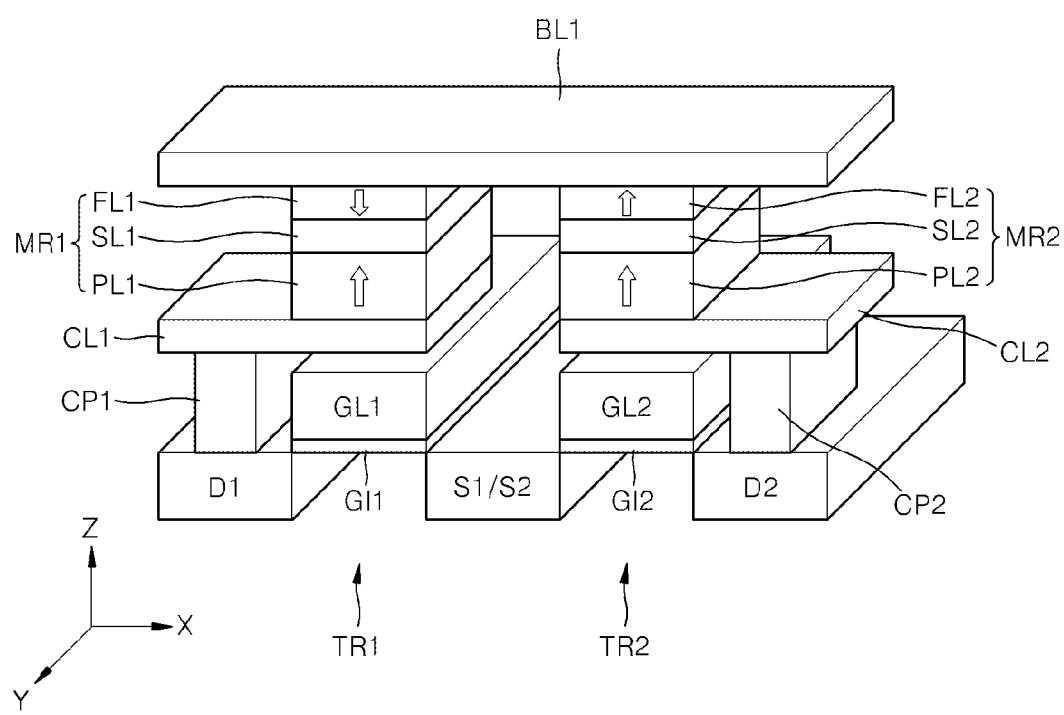

Due to the Rashba field $F_{RB1}$ and the external magnetic field $F_{EX1}$, the magnetization direction of the first free layer FL1 may be changed from the Z-axis direction to a reverse Z-axis direction. Due to the Rashba field $F_{RB1}$ and the external magnetic field $F_{EX1}$ which are perpendicular to each other, the magnetization (that is, a magnetic moment) of the first free layer FL1 may be perturbed, and an axis of the magnetization (that is, a magnetic moment) may rotate on a particular orbital. The rotating of the axis of the magnetization (that is, magnetic moment) on a particular orbital is referred to as a precession. As such, while the precession of the magnetization of the first free layer FL1, the magnetization direction may be switched to the reverse Z-axis direction. That is, when the Rashba field $F_{RB1}$ is applied in the Y-axis direction and the external magnetic field $F_{EX1}$ is applied in the reverse X-axis direction, the Rashba field $F_{RB1}$ and the external magnetic field $F_{EX1}$ may affect the magnetization of the first free layer FL1 such that the magnetization direction is changed to the reverse Z-axis direction. Thus, the magnetization direction of the first free layer FL1 may be switched from the Z-axis direction to the reverse Z-axis direction. The switching result of the magnetization direction of the first free layer FL1 illustrated in FIG. 9A to the reverse Z-axis direction is illustrated in FIG. 9B. The first magnetoresistive element MR1 illustrated in FIG. 9B may be considered as having a first data written thereon.

Figure 9C:
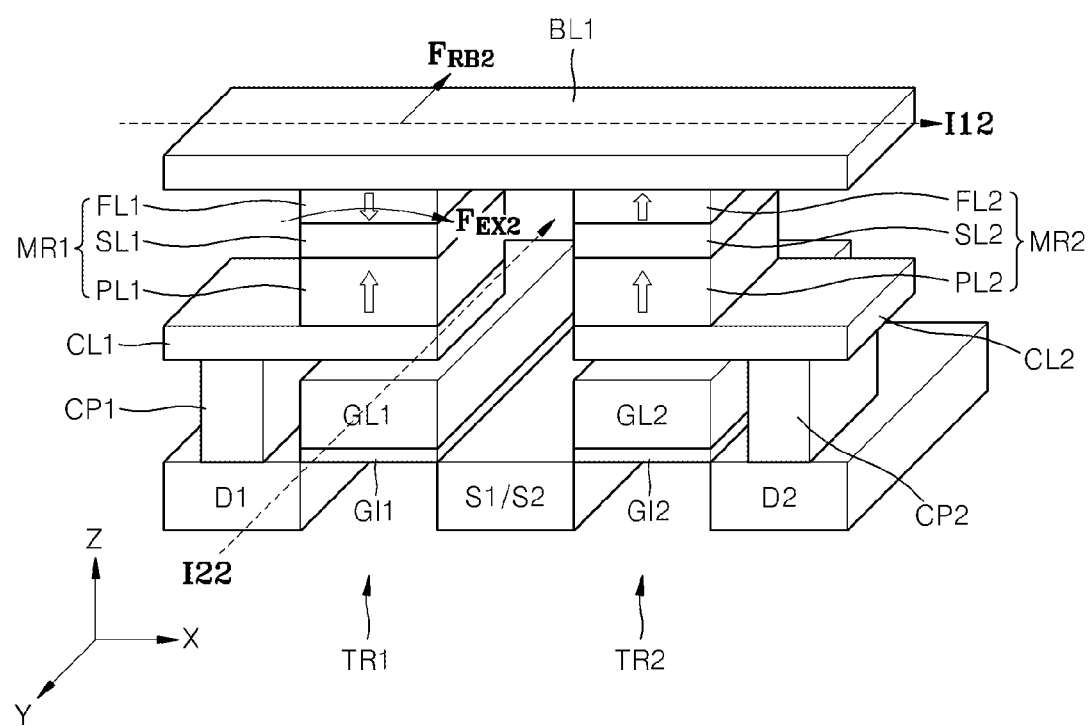

Referring to FIG. 9C, in a state where the first free layer FL1 is magnetized in the reverse Z-axis, a first current I12 may be provided to the bit line BL1 and a second current I22 may be provided to the first gate line GL1. Due to the first current I12 provided to the bit line BL1, a Rashba field $F_{RB2}$ may occur in the first free layer FL1. When the first current I12 is provided in the X-axis direction, the Rashba field $F_{RB2}$ may occur in the reverse Y-axis direction. Here, the same Rashba field (not shown) may occur in the second free layer FL2. Due to the second current I22 provided to the first gate line GL1, an external magnetic field $F_{EX2}$ may be applied to the first free layer FL1. The second current I22 may be provided in the reverse Y-axis direction, and the external magnetic field $F_{EX2}$ may be applied to the first free layer FL1 in the X-axis direction (or a direction similar thereto). Accordingly, the application direction of the external magnetic field $F_{EX2}$ in the first free layer FL1 may be perpendicular to the direction of the Rashba field $F_{RB2}$, or may be similar to the perpendicular direction. In the first free layer FL1, the application direction of the external magnetic field $F_{EX2}$ may be identical or similar to the direction of the first current I12 provided to the bit line BL1 to induce the Rashba field $F_{RB2}$.

Figure 9D:
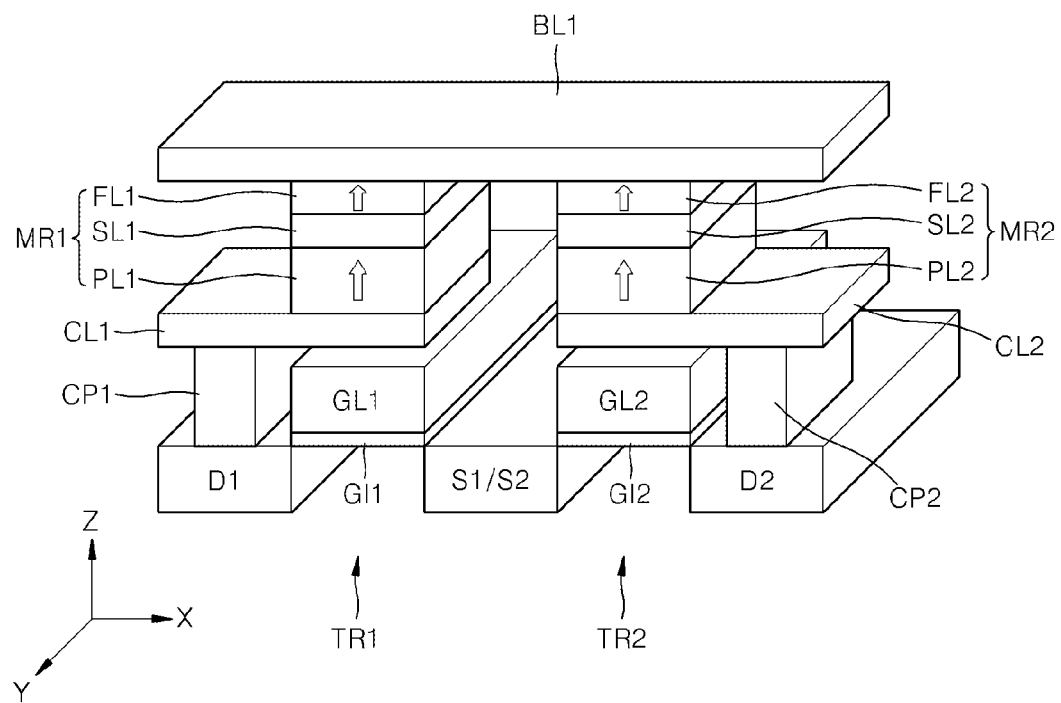

Due to the Rashba field $F_{RB2}$ and the external magnetic field $F_{EX2}$, the magnetization direction of the first free layer FL1 may be switched from in the reverse Z-axis direction to the Z-axis direction. Due to the Rashba field $F_{RB2}$ and the external magnetic field $F_{EX2}$, the magnetization (that is, a magnetic moment) of the first free layer FL1 may be precessed, and switched to the Z-axis direction. That is, when the Rashba field $F_{RB2}$ is applied in the reverse Y-axis direction and the external magnetic field $F_{EX2}$ is applied in the X-axis direction, due to the Rashba field $F_{RB2}$ and the external magnetic field $F_{EX2}$, the magnetization of the first free layer FL1 may be forced toward the Z-axis direction. Thus, the magnetization direction of the first free layer FL1 may be switched from the reverse Z-axis direction to the Z-axis direction. The switching result of the magnetization direction of the first free layer FL1 illustrated in FIG. 9C to the Z-axis direction is illustrated in FIG. 9D. The first magnetoresistive element MR1 illustrated in FIG. 9D may be considered as having a second data written thereon.

In a method similar to the method described with reference to FIGS. 9A to 9D, the magnetization direction of the second free layer FL2 may be switched. That is, a first current may be provided to the bit line BL1 and a second current may be provided to the second gate line GL2 to apply a Rashba field and an external magnetic field perpendicular to the Rashba field to the second free layer FL2, thereby switching the magnetization direction of the second free layer FL2.

During data writing as described above, the first and second transistors TR1 and TR2 may not operate, that is, may be turned off. Without turning on the first and second transistors TR1 and TR2, at least one of the first and second gate lines GL1 and GL2 may be used to generate a magnetic field (that is, the external magnetic field). When the first and second gate lines GL1 and GL2 are used as a conductive line for generating a magnetic field (that is, the external magnetic field) to perform data writing, a selected voltage may be applied to a substrate (not shown) so as not to turn on the first and second transistors TR1 and TR2.

In the present example embodiments, the magnetization directions of the free layers FL1 and FL2 may be perpendicularly switched by using the Rashba fields $F_{RB1}$ and $F_{RB2}$ and the external magnetic fields $F_{EX1}$ and $F_{EX2}$ to write data on the first and second magnetoresistive elements MR1 and MR2. In this regard, the Rashba fields $F_{RB1}$ and $F_{RB2}$ may occur due to the first currents I11 and I12 flowing through the bit line BL1, and the external magnetic fields $F_{EX1}$ and $F_{EX2}$ may occur due to the second currents I21 and I22 flowing through the gate lines GL1 and GL2. Accordingly, a current (that is, I11/I21 or I12/I22) for writing may not flow through the first and second magnetoresistive elements MR1 and MR2.

In a typical STT-MRAM, a magnetization direction of a free layer is switched by using a current flowing through a magnetoresistive element (that is, an MTJ element). Accordingly, a separation layer (that is, a tunneling layer) of the magnetoresistive element (that is, an MTJ element) needs to have very high endurance. Also, because ranges of a writing voltage (that is, a switching voltage) and a read voltage need to be determined within a voltage range in which the separation layer (that is, a tunneling layer) is not broken down, there are many limitations to set a range of an operation voltage (writing voltage and read voltage). When a distribution (range) of the writing voltage and a distribution (range) of the read voltage are close to a distribution (range) of a breakdown voltage of the separation layer (that is, tunneling layer), an operation error, such as a writing error, and reliability related problems may occur. To suppress these problems, the distribution (range) of the writing voltage, the distribution (range) of the read voltage, and the distribution (range) of the breakdown voltage need to be strictly managed (controlled). These problems may make commercialization of STT-MRAM difficult.

However, in the present example embodiments, a current does not flow through the first and second magnetoresistive elements MR1 and MR2, and a current is provided to only the bit line BL1 and the first and second gate lines GL1 and GL2 to switch the magnetization directions of the free layers FL1 and FL2. That is, in the present example embodiments, currents for switching the magnetization direction of the free layers FL1 and FL2, that is, the first currents I11 and I12 and the second currents I21 and I22, do not flow through the first and second magnetoresistive elements MR1 and MR2. Accordingly, in the present example embodiments, any damage to the separation layers SL1 and SL2 (that is, a tunneling layer) of the first and second magnetoresistive elements MR1 and MR2 by a switching current (that is, a writing current) or deterioration of characteristics of the separation layers SL1 and SL2 may be prevented. Accordingly, endurance requirement conditions with respect to the separation layers SL1 and SL2 (that is, a tunneling layer) may be relieved, and deterioration of characteristics of the first and second magnetoresistive elements MR1 and MR2 by the writing current may be prevented. In addition, although the read current may be applied to flow through the first and second magnetoresistive elements MR1 and MR2, the intensity of the read current is much lower than that of the writing current of a typical STT-MRAM, the damage to the separation layers SL1 and SL2 (that is, a tunneling layer) by the read current or deterioration of the separation layers SL1 and SL2 by the read current may not occur. Also, in the present example embodiments, because the writing current does not flow through the first and second magnetoresistive elements MR1 and MR2, there is no need to consider a distribution (range) of a writing voltage with respect to the first and second magnetoresistive elements MR1 and MR2. That is, regarding the first and second magnetoresistive elements MR1 and MR2, only the distribution (range) of a read voltage and the distribution (range) of a breakdown voltage may be taken into consideration. Accordingly, requirements for the management of an operation voltage are relieved, and a range of the operation voltage may be freely set, and the possibility of occurrence of an operation error may be lowered. Thus, a device structure according to example embodiments may be advantageous for commercialization of an MRAM.

Also, a typical STT-MRAM requires a large-size cell transistor to switch the magnetization direction of a free layer. That is, when a material with high magnetic anisotropy energy is used as a free layer material to obtain data retention characteristics of a free layer, the magnitude of a current (that is, a switching current) that is required to switch the magnetization direction of the free layer increases, leading to a need for a large-size cell transistor. However, in the present example embodiments, there is no need for manufacturing a cell transistor, that is, the first and second transistors TR1 and TR2, in large size. This is because during data writing, a writing current is not applied from the first and second transistors TR1 and TR2. To perform data writing, the first current I11 or I12 is provided to the bit line BL1 and the second current I21 or I22 is provided to the gate lines GL1 and GL2, and these currents may be driven by a driving device of a peripheral circuit unit. Manufacturing a large driving device of a peripheral circuit unit is easier than manufacturing a large cell transistor, and the size of the driving device may not affect the overall size of a device. Accordingly, a magnetic memory device according to example embodiments may be suitable for high integration and high densification.

Additionally, in the case of a typical MRAM in which a magnetization direction of a free layer is switched using a digit line and a bit line, the use of an MTJ element having a horizontal magnetization and a relatively complicated structure make it difficult to realize high-densification. In addition, in the typical MRAM, even a cell adjacent to a target cell that is to be switched may be switched or half-switched. This phenomenon is referred to as a cross talk. However, in the case of a magnetic memory device according to example embodiments, magnetoresistive elements MR1 and MR2 having a perpendicular magnetization are used and also, the magnetic memory device has a more simplified structure than the typical MRAM. Thus, the magnetic memory device according to example embodiments is suitable for high integration and high densification. Also, in a magnetic memory device according to example embodiments, the Rashba fields $F_{RB}$, and $F_{RB2}$ affect only inside the free layer FL1, and do not affect outside of the free layer FL1. Accordingly, the cross talk may be prevented or suppressed.

Figure 10:
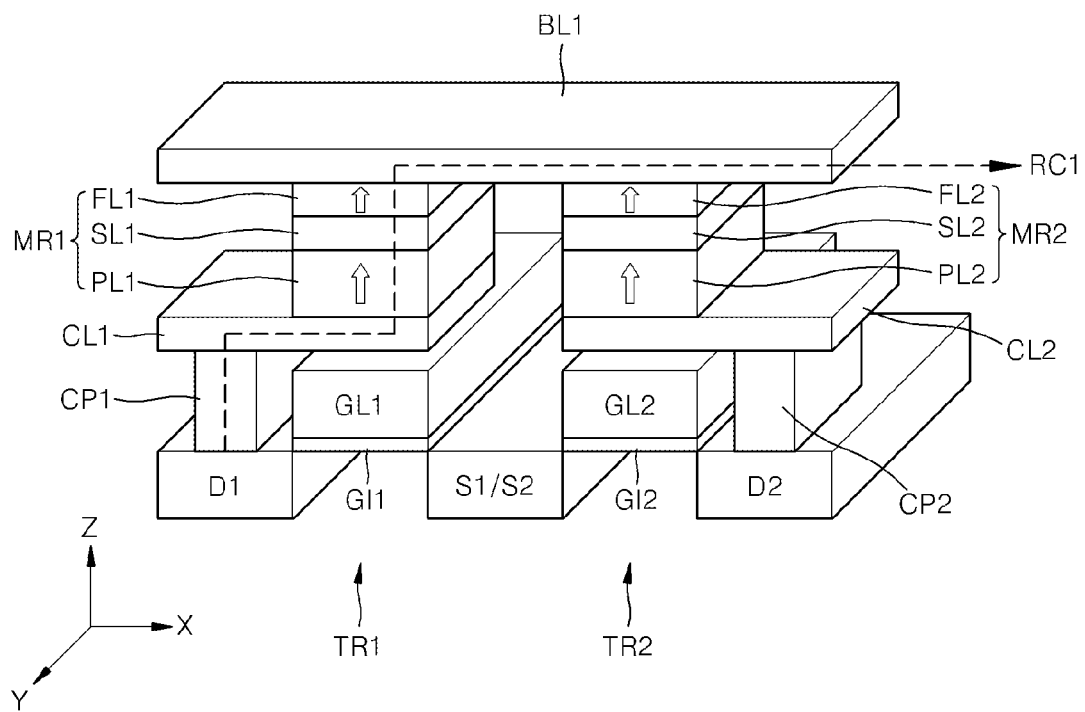

FIG. 10 is a perspective view for explaining a data read method of a magnetic memory device according to example embodiments.

Referring to FIG. 10, after the first transistor TR1 is turned on, a read current RC1 may be applied between the first transistor TR1 and the bit line BL1. The read current RC1 may flow through the first magnetoresistive element MR1. Data written on the first magnetoresistive element MR1 may be identified by measuring a resistance of the first magnetoresistive element MR1 by providing the read current RC1 to the first magnetoresistive element MR1. When the magnetization direction of the first pinned layer PL1 and the magnetization direction of the first free layer FL1 are parallel (in a same direction), the first magnetoresistive element MR1 may have a low resistance, and when the magnetization direction of the first pinned layer PL1 and the magnetization direction of the first free layer FL1 are anti-parallel (in an opposite direction), the first magnetoresistive element MR1 may have a high resistance.

During data reading as described above, the first and second gate lines GL1 and GL2 may be used for turning ON/OFF of the first and second transistors TR1 and TR2. That is, a selected voltage is applied to the first gate line GL1 to turn on the first transistor TR1, and then, the read current RC1 may be provided between the first transistor TR1 and the bit line BL1. Although the read current RC1 flows through the first magnetoresistive element MR1, because the intensity of the read current RC1 is low, the magnetization direction of the first free layer FL1 may not be changed. The first and second transistors TR1 and TR2 may be selectively driven only when data reading is performed. Because the magnitude of the current (the read current) provided by the first and second transistors TR1 and TR2 is low, sizes of the first and second transistors TR1 and TR2 may be small.

The operation methods explained with reference to FIGS. 9A through 9D and 10 relate to the structure of FIG. 5. However, these operation methods may also be applied to the structures of FIGS. 6 through 8 in a similar manner. This may be obvious to one of ordinary skill in the art, and thus, a detailed description thereof is not presented herein.

In the description above, the magnetic memory devices and the operation methods according to the above example embodiments have been described in detail. However, the description does not limit the scope, and is presented to provide only examples of detailed embodiments. For example, one of ordinary skill in the art may know that the magnetic memory devices of FIGS. 1 through 8 may be variously changed. In detail, each of the magnetoresistive elements MR1, MR1', MR2, and MR2' may further include at least one layer other than the pinned layers PL1 and PL2, the separation layers SL1 and SL2, and the free layers FL1 and FL2. Also, in the structures of FIGS. 5 through 8, the bit line BL1 may be repeatedly arranged in the Y-axis direction, and the gate lines GL1 and GL2 may be repeatedly arranged in the X-axis direction, and at intersection points thereof, the magnetoresistive elements MR1 and MR2 may be provided. In addition, one of ordinary skill in the art may know that the operation methods explained with reference to FIGS. 9A through 9D and FIG. 10 may be variously changed. Also, a structure according to example embodiments may be applied to, in addition to a memory device, other devices, for example, a non-volatile logic device. Accordingly, the scope is defined not by the above example embodiments but by the technical features recited in the claims.

What is claimed is:

1. A magnetic memory device, comprising:
a magnetoresistive element including a free layer, a pinned layer, and a separation layer between the free layer and the pinned layer;
a first conductive line contacting the free layer and configured to apply a Rashba field to the free layer; and
a second conductive line spaced apart from the free layer and configured to apply an external magnetic field to the free layer,
wherein the magnetic memory device is configured to apply a first current to the first conductive line to induce the Rashba field, the Rashba field being applied to the free layer in a first direction parallel to the free layer,
wherein at least a portion of the external magnetic field is applied to the free layer in a second direction perpendicular to the first direction and parallel to the free layer, and
wherein a magnetization direction of the free layer is switchable in a vertical direction by application of the Rashba field and the external magnetic field to the free layer.

2. The magnetic memory device of claim 1, wherein the free layer and the pinned layer have perpendicular magnetic anisotropy.

3. The magnetic memory device of claim 1, wherein, the second conductive line is configured to apply the external magnetic field to the free layer in a direction identical to a direction of the first current.

4. The magnetic memory device of claim 1, wherein, the magnetoresistive element has a bottom-pinned structure in which the pinned layer is under the free layer, the first conductive line is on an upper surface of the magnetoresistive element, and the second conductive line is under the magnetoresistive element.

5. The magnetic memory device of claim 1, wherein, the magnetoresistive element has a top-pinned structure in which the pinned layer is above the free layer, the first conductive line is on a lower surface of the magnetoresistive element, and the second conductive line is under the first conductive line.

6. The magnetic memory device of claim 1, wherein, the first conductive line is a bit line, and the second conductive line is a word line.

7. The magnetic memory device of claim 1, wherein, the first conductive line and the second conductive line cross each other, and the magnetoresistive element is at an intersection point of the first conductive line and the second conductive line.

8. The magnetic memory device of claim 1, further comprising:
a switching device connected to the magnetoresistive element.

9. The magnetic memory device of claim 8, wherein the second conductive line is a part of the switching device.

10. The magnetic memory device of claim 8, wherein the switching device includes a transistor, and
the second conductive line is a gate line of the transistor.

11. The magnetic memory device of claim 10, wherein the transistor includes a drain connected to the pinned layer.

12. The magnetic memory device of claim 8, wherein,
the switching device include a first transistor and a second transistor,
a first magnetoresistive element is on the first transistor, the first magnetoresistive element being the magnetoresistive element,
a second magnetoresistive element is on the second transistor, and
the first conductive line is commonly connected to the first and second magnetoresistive elements.

13. The magnetic memory device of claim 12, wherein,
the first transistor includes a first gate line,
the second transistor includes a second gate line, and
each of the first and second gate lines corresponds to the second conductive line.

14. The magnetic memory device of claim 13, wherein,
the first magnetoresistive element is on the first gate line,
the second magnetoresistive element is on the second gate line, and
the first conductive line is on the first and second magnetoresistive elements.

15. The magnetic memory device of claim 13, wherein,
the first magnetoresistive element is on the first gate line,
the second magnetoresistive element is on the second gate line, and
the first conductive line is interposed between the first and second gate lines and the first and second magnetoresistive elements.

16. The magnetic memory device of claim 12, wherein the first and second transistors are both connected to a single source.

17. The magnetic memory device of claim 1, further comprising:
a magnetic field focusing element configured to focus the external magnetic field on the magnetoresistive element.

18. The magnetic memory device of claim 17, wherein the magnetic field focusing element includes a cladding layer on side walls of the second conductive line.

19. The magnetic memory device of claim 18, wherein the cladding layer includes a magnetic material containing at least one of nickel (Ni), cobalt (Co), and iron (Fe).

20. A magnetic memory device, comprising:
a transistor including a source, a drain, and a gate;
a magnetoresistive element connected to the transistor, wherein the magnetoresistive element includes a free layer, a pinned layer, and a separation layer between the free layer and the pinned layer; and
a bit line connected to the magnetoresistive element, the bit line being in contact with the free layer,
wherein the bit line is configured to induce a Rashba field in the free layer,
the magnetic memory device being configured to apply a first current to the bit line to induce the Rashba field,
the gate is configured to apply an external magnetic field to the free layer, and
a magnetization direction of the free layer is switchable by the Rashba field and the external magnetic field.

21. The magnetic memory device of claim 20, wherein the bit line is connected to the free layer.

22. The magnetic memory device of claim 20, wherein the drain is connected to the pinned layer.

23. The magnetic memory device of claim 20, wherein the magnetoresistive element is above the gate.

24. The magnetic memory device of claim 20, wherein
the gate has a line shape crossing the bit line, and
the magnetoresistive element is at an intersection point of the gate and the bit line.

25. The magnetic memory device of claim 20, wherein
the magnetoresistive element has a bottom-pinned structure in which the pinned layer is under the free layer,
the bit line is on an upper surface of the magnetoresistive element, and
the gate is under the magnetoresistive element.

26. The magnetic memory device of claim 20, wherein
the magnetoresistive element has a top-pinned structure in which the pinned layer is above the free layer,
the bit line is on a lower surface of the magnetoresistive element, and
the gate is under the bit line.

27. A method of operating a magnetic memory device including a magnetoresistive element having a free layer, a pinned layer and a separation layer therebetween, a first conductive line contacting the free layer, and a second conductive line spaced apart from the free layer, the method comprising:
writing data on the magnetoresistive element,
wherein the writing of data includes,
applying a Rashba field to the free layer by providing a first current to the first conductive line; and
applying an external magnetic field to the free layer by providing a second current to the second conductive line,
wherein the Rashba field is applied to the free layer in a first direction parallel to the free layer,
wherein at least a portion of the external magnetic field is applied to the free layer in a second direction perpendicular to the first direction and parallel to the free layer, and
wherein a magnetization direction of the free layer is switched in a vertical direction by the Rashba field and the external magnetic field.

28. The method of claim 27, wherein the free layer and the pinned layer have perpendicular magnetic anisotropy.

29. The method of claim 27, wherein,
the free layer has a magnetization direction extending in a first direction, prior to applying the Rashba field and the external magnetic field, and
the magnetization direction of the free layer is switched to extend in a second direction by applying the Rashba field and the external magnetic field, and
one of the first direction and the second direction is an upward direction, and the other one of the first direction and the second direction is an downward direction.

30. The method of claim 27, wherein the external magnetic field is applied to the free layer in a direction that is identical to a direction of the first current.

31. The method of claim 27, further comprising:
applying a second Rashba field to the free layer by providing a third current to the first conductive line, the third current having a direction opposite to that of the first current; and applying a second external magnetic field to the free layer by providing a fourth current to the second conductive line, the fourth current having a direction opposite to that of the second current.

32. The method of claim 27, wherein, the magnetic memory device further includes a switching device connected to the magnetoresistive element, and the second conductive line is a part of the switching device.

33. The method of claim 32, wherein, the switching device includes a transistor, and the second conductive line is a gate line of the transistor.

* * * * *